United States Patent
Guitton et al.

(10) Patent No.: US 6,862,196 B2
(45) Date of Patent: Mar. 1, 2005

(54) INTEGRATED SWITCH WITH RF TRANSFORMER CONTROL

(75) Inventors: Fabrice Guitton, Tours (FR); Robert Pezzani, Vouvray (FR)

(73) Assignee: STMicroelectronics S.A., Montrouge (FR)

( * ) Notice: Subject to any disclaimer, the term of this patent is extended or adjusted under 35 U.S.C. 154(b) by 10 days.

(21) Appl. No.: 10/182,420

(22) PCT Filed: Dec. 20, 2001

(86) PCT No.: PCT/FR01/04136

§ 371 (c)(1),
(2), (4) Date: Oct. 9, 2002

(87) PCT Pub. No.: WO02/50850

PCT Pub. Date: Jun. 27, 2002

(65) Prior Publication Data

US 2003/0075990 A1 Apr. 24, 2003

(30) Foreign Application Priority Data

Dec. 21, 2000 (FR) ............................................. 00 16837

(51) Int. Cl.⁷ ............................................ H02M 3/335
(52) U.S. Cl. ........................... 363/18; 363/19; 307/140
(58) Field of Search ...................... 363/18, 19; 307/140

(56) References Cited

U.S. PATENT DOCUMENTS

| | | | | |
|---|---|---|---|---|
| 4,499,452 A | * | 2/1985 | Nicolas | 340/310.07 |
| 4,504,775 A | * | 3/1985 | Becker | 320/140 |
| 4,713,723 A | | 12/1987 | Kaufman | |
| 5,353,001 A | | 10/1994 | Meinel et al. | |
| 5,355,301 A | * | 10/1994 | Saito et al. | 363/147 |
| 5,359,279 A | * | 10/1994 | Gidon et al. | 323/282 |
| 5,537,021 A | * | 7/1996 | Weinberg et al. | 320/166 |
| 6,351,359 B1 | * | 2/2002 | Jaeger | 361/93.9 |
| 6,511,764 B1 | * | 1/2003 | Marten | 429/7 |

FOREIGN PATENT DOCUMENTS

| | | |
|---|---|---|
| EP | 0 177 675 A2 | 6/1985 |
| FR | 2 641 639 A1 | 10/1994 |
| WO | WO 92 16920 A | 10/1992 |

OTHER PUBLICATIONS

International Search Report from PCT/FR01/04136 filed Dec. 20, 2001.
Bourgeois J.M., *PCB Based Transformer for Power MOSFET Driver*, Proceedings of the Annual Applied Power (APEC) Orlando, Feb. 13–17, 1994, New York, IEEE, vol. 1 conf. 9 pp. 238–244 XP000467323.
Patent Abstracts of Japan vol. 018, No. 477 (E–1602), Sep. 6, 1994, & JP 06 163282 A (Hitachi Ltd) Jun. 10, 1994.

* cited by examiner

*Primary Examiner*—Bao Q. Vu
(74) *Attorney, Agent, or Firm*—Lisa K. Jorgenson; William R. McClellan; Wolf, Greenfield & Sacks, P.C.

(57) ABSTRACT

The invention concerns a control circuit for controlling a power switch by means of a galvanic insulation transformer, the transformer being produced in the form of planar conductive windings on an insulating substrate (20) whereon are integrated passive components constituting a high frequency excitation oscillating circuit for a primary winding of the transformer, the transformer substrate being directly mounted on a wafer (24) whereon is mounted a circuit chip (40) integrating the power switch.

21 Claims, 4 Drawing Sheets

INTEGRATED SWITCH WITH RF TRANSFORMER CONTROL

BACKGROUND OF THE INVENTION

1. Field of the Invention

The present invention relates to power circuit control systems requiring galvanic isolation between the control and the power circuit. Such systems are generally used for controlling loads supplied by the A.C. power system. The galvanic isolation essentially has the function of protecting the control circuit and its user.

2. Discussion of the Related Art

FIG. 1 very schematically shows a first conventional example of a device for galvanic isolation between a control circuit and a power circuit. This device is a transformer T forming an isolation barrier IB and having a primary winding T1 connected to two output terminals of a control circuit 1 and a secondary winding T2 that controls a power switch K. In the example of FIG. 1, switch K is a thyristor connected between two terminals 2 and 3 of the power circuit, not shown. The (cathode) gate of thyristor K is connected to a first terminal of winding T2, the other terminal of which is connected to terminal 3 generally representing a reference voltage (for example, the ground). On the primary side, control circuit 1 is generally supplied by a low-voltage source (not shown). Either low-frequency control transformers (up to a few tens of kilohertz), or transformers excited by a synchronous pulse upon each halfwave of an A.C. supply voltage on the secondary side are provided.

A disadvantage of control systems of the type illustrated in FIG. 1 is that a discrete transformer is required, which is thus bulky and expensive.

FIG. 2 shows a second known example of a galvanic isolation control system. In the example of FIG. 2, the crossing of isolation barrier IB is optical. An optocoupler OP, the excitation diode D of which receives a control signal from a circuit 4 (CTRL) and the phototransistor TO of which provides a control signal to a circuit 5 (PWCTRL) of control of a switch K is for example used. As previously, switch K is connected across two terminals 2 and 3 downstream of the isolation barrier. In the example of FIG. 2, said switch again is a thyristor having its gate connected to control circuit 5.

Even though the optocoupler may in some cases be integrated, the use of control electronics (circuit 5) downstream of the isolation barrier most often is a disadvantage.

Other galvanic isolation barriers are known. For example, the simplest is formed of capacitors placed on each conductor to be isolated. The capacitors must then hold high voltages and are thus bulky and expensive. Further, as in the case of FIG. 2, they require electronic circuitry to control the thyristor or the triac that constitutes the switch downstream of the isolation barrier.

SUMMARY OF THE INVENTION

The present invention aims at providing a system for controlling a power switch that respects the constraints of a galvanic isolation between a control part and a power part and that requires no control electronics downstream of this isolation barrier.

The present invention also aims at providing a solution which is neither bulky nor expensive.

The present invention further aims at providing a solution which optimizes the control system integration.

To achieve these objects, the present invention provides a circuit for controlling a power switch by means of at least one galvanic isolation transformer made in the form of planar conductive windings on an isolating substrate on which passive components constitutive of a high-frequency oscillating circuit of excitation of a primary winding of the transformer are integrated, the transformer substrate being placed on a wafer on which is assembled a circuit chip integrating the power switch.

According to an embodiment of the present invention, an active component of the oscillating circuit for controlling the transformer is made in the form of an integrated circuit chip placed on a surface of said substrate opposite to the wafer on which this substrate is assembled.

According to an embodiment of the present invention, the frequency of excitation of the transformer by the oscillating circuit is greater than 40 MHz.

According to an embodiment of the present invention, said substrate is glass.

According to an embodiment of the present invention, a secondary winding of the transformer is connected to a control electrode of the power switch via a diode, the latter forming, with a stray capacitance of the power switch control electrode, a peak detector.

According to an embodiment of the present invention, the power switch is a thyristor or a triac.

According to an embodiment of the present invention, the circuit includes two transformers for controlling two power switches respectively associated with a polarity of an A.C. power supply, the two primary windings of the two transformers being controlled by a same oscillating circuit.

The present invention also provides a transmission-reception device of a high-frequency signal on a low-frequency supply network, including:
- a transmitter formed of a high-frequency oscillating signal of excitation of a primary winding of a first transformer having a secondary winding connected to the network conductors; and
- a receiver formed of a second galvanic isolation transformer for controlling a switch, at least said first transformer being made in the form of planar conductive windings on a first isolating substrate on which are integrated passive components constitutive of the oscillating circuit.

According to an embodiment of the present invention, said second transformer is made in the form of planar conductive windings on a second isolating substrate, the second substrate being placed on a wafer on which is assembled a circuit chip integrating the switch.

The foregoing and other objects, features and advantages of the present invention, will be discussed in detail in the following non-limiting description of specific embodiments in connection with the accompanying drawings, in which:

DETAILED DESCRIPTION

Figure 1:
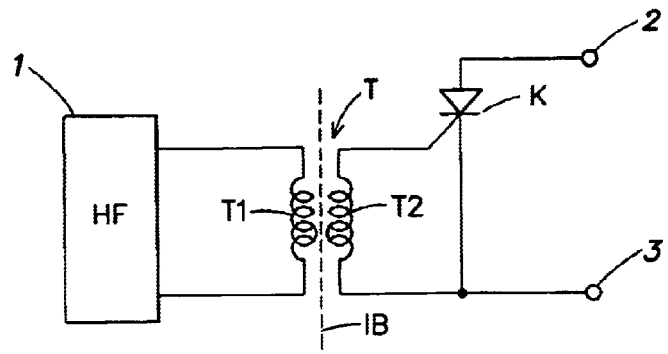
FIGS. 1 and 2, previously described, are intended to show the state of the art and the problem to solve.

The same elements have been designated with the same references in the different drawings. For clarity, only those elements which are necessary to the understanding of the present invention have been shown in the drawings and will be described hereafter. In particular, the circuits to be controllable by the power switch, have not been shown and are no object of the present invention. Neither have the possible circuits providing the operating set point of the control circuit upstream of the isolation barrier.

Figure 2:
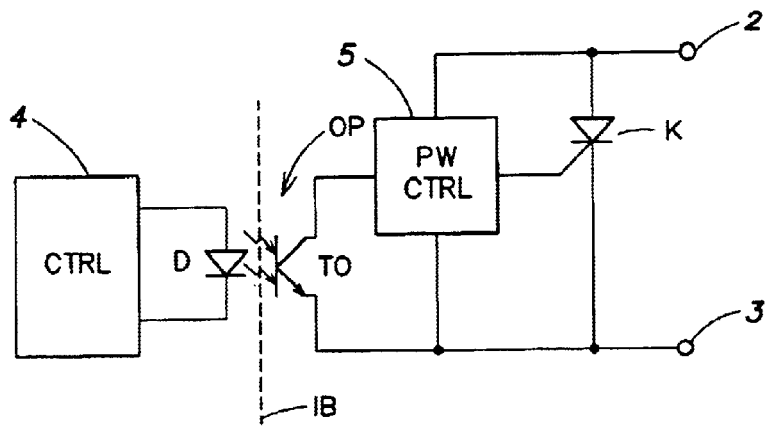
Figure 3:
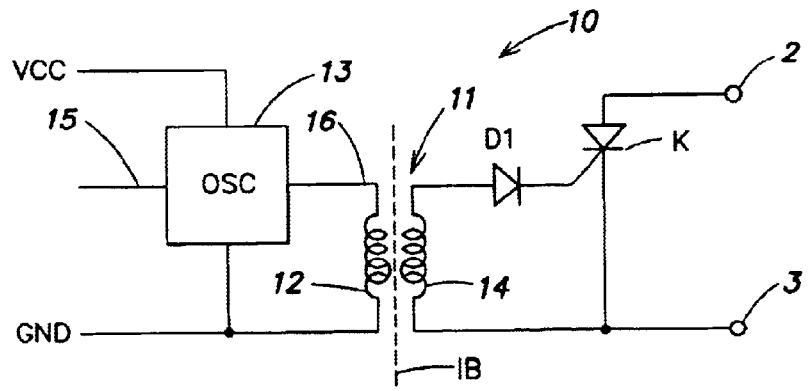
FIG. 3 very schematically shows an embodiment of a circuit for controlling a power switch according to the present invention.

FIG. 3 shows an embodiment of a control circuit 10 of a power switch K with a galvanic isolation (barrier IB). The representation of FIG. 3 should be compared with those of conventional FIGS. 1 and 2.

According to the present invention, a transformer 11 at very high frequency (several tens of MHz at least) having a primary winding 12 controlled by a circuit 13 (OSC) is used. A secondary winding 14 of transformer 11 is used to control a power switch K downstream of isolation barrier IB. As previously, switch K is connected between two terminals 2 and 3 of the circuit to be controlled. In the example of FIG. 3, switch K is formed of a thyristor having its (cathode) gate connected, according to the present invention, to a first terminal of winding 14 by a diode D1, the cathode of diode D1 being connected to the gate of thyristor K. The function of diode D1 is to form, with the junction capacitor of thyristor K, a peak detector of the signal in winding 14.

At the primary, circuit 13 forms an oscillator powered by a low D.C. voltage (VCC-GND). A control terminal 15 receives a signal for disabling the oscillator of circuit 13. An output terminal 16 of circuit 13 is connected to a first terminal of primary winding 12 of transformer 11, the second terminal of winding 12 being connected to ground GND.

A feature of the present invention is to use a transformer 11 integrated on an isolating substrate (preferably, made of glass). To enable integration of the transformer, the excitation frequency thereof is, according to the present invention, of several tens of MHz and, preferably, greater than 40 MHz.

Another feature of the present invention is to take advantage of the insulating substrate of the transformer to integrate therein all the passive components that constitute control circuit 13.

Another feature of the present invention is to use the isolating substrate on which is integrated transformer 11 to isolate the passive components integrated on this substrate, with respect to the power electrodes of the switch on the secondary side. This feature of the present invention will better appear from the subsequent discussion of FIG. 6.

Figure 4:
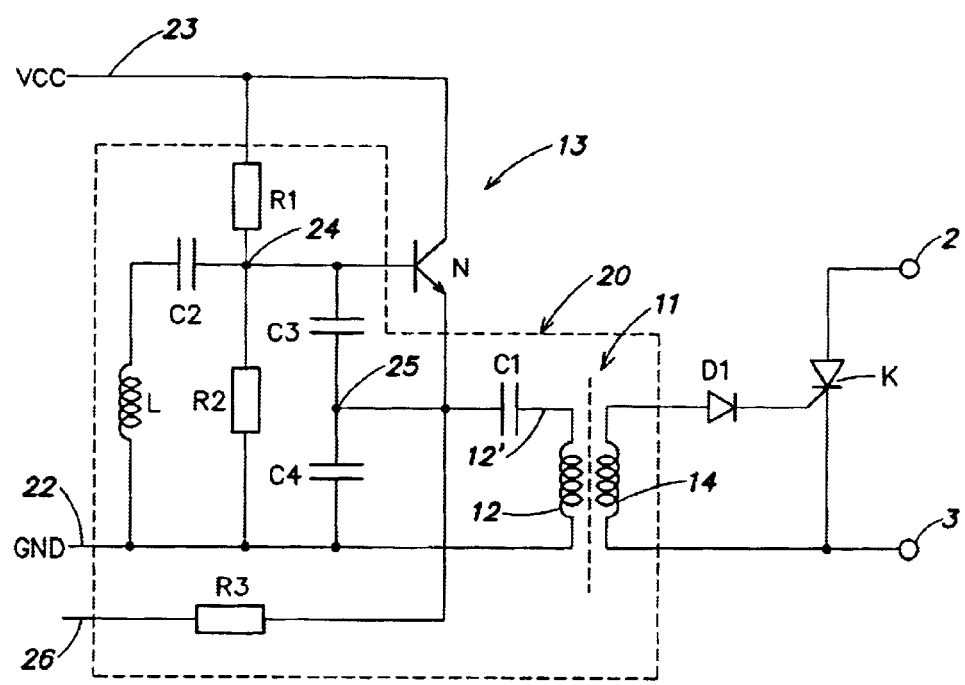
FIG. 4 shows a top view of an embodiment of a circuit integrating an isolation transformer according to the present invention.
Figure 5:
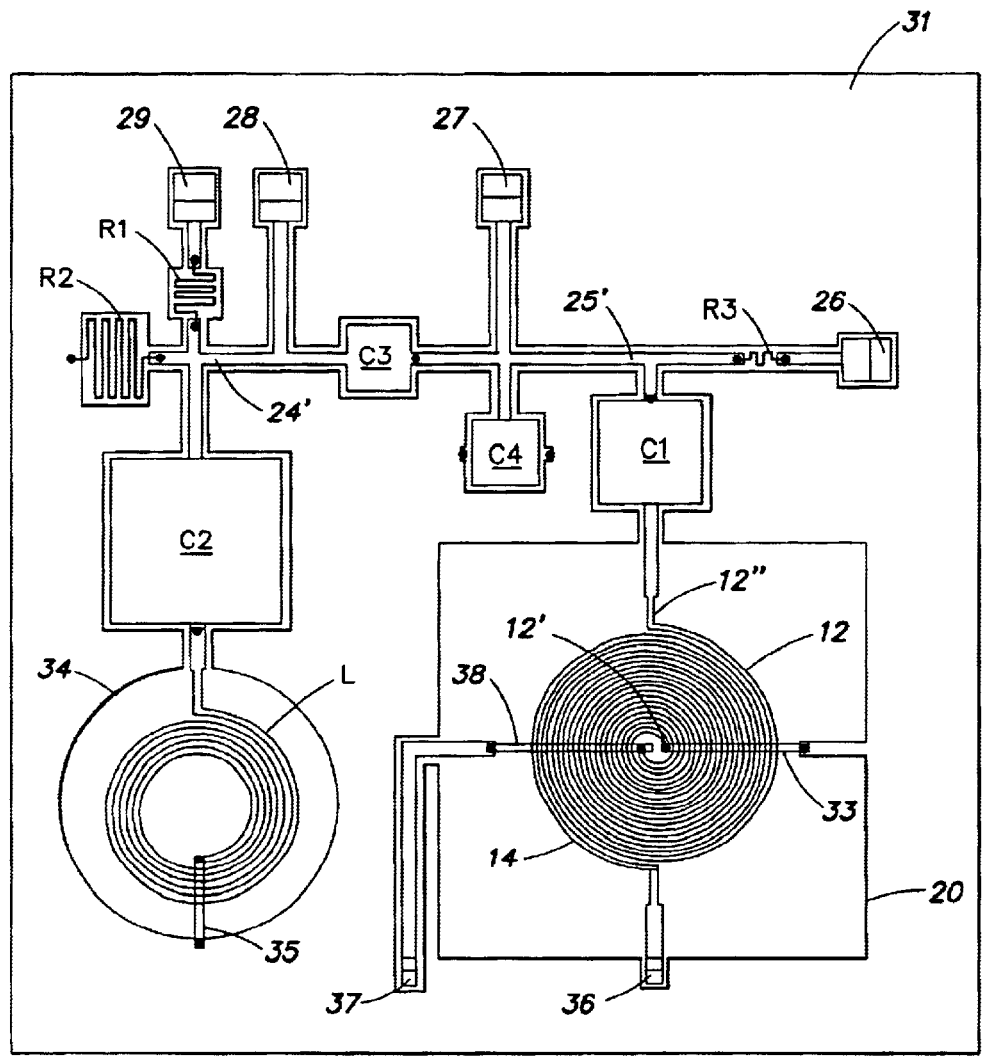
FIG. 5 shows an embodiment of a very high-frequency control circuit and of an isolation transformer according to the present invention.

FIGS. 4 and 5 respectively show, by the equivalent electric diagram and by a top view of the isolating substrate, an embodiment of oscillating circuit 13, of control circuit 10, and of transformer 11 of the present invention.

In the example of FIG. 4, circuit 13 is formed of a collpits-type oscillator. It includes an NPN-type bipolar transistor N. The collector of transistor N is connected to a terminal 23 of application of supply voltage VCC. Its emitter is connected, by a capacitor C1, to a first end 12' of primary winding 12 of transformer 11. The base of transistor N is connected, by an inductance L in series with a capacitor C2, to ground terminal GND. The base of transistor N is also connected to the junction point 24 of two resistors R1 and R2 forming a polarity dividing bridge between terminals 23 and 22. Two capacitors C3 and C4 in series connect the base of transistor N to ground. The midpoint 25 of this series connection is connected to the emitter of transistor N. This is a conventional structure of an oscillator with a negative resistance obtained by the feedback on the transistor emitter (base-emitter junction and capacitors C3 and C4). A resistor R3 connects the emitter of transistor N to a control input 26. Resistor R3 biases the transistor and sets the collector (or emitter) current. The base-emitter voltage of transistor N is set by the ratio of resistance R1 to the sum of resistances R2 and R3. When input 26 is connected to ground, the oscillator is active. To deactivate the oscillator, terminal 26 is connected to positive voltage VCC, which annuls the collector-emitter voltage of transistor N.

The oscillation frequency is provided by relation $1/(2\pi \sqrt{LC})$, where C represents the equivalent capacitance of capacitors C2, C3, and C4 in series, neglecting the stray capacitances of the transistor.

The different passive components described in relation with FIG. 4 can be found on the top view of FIG. 5.

In the example of FIG. 5, the substrate (schematized by dotted lines 20 in FIG. 4) is a glass substrate on which are deposited conductive layers to form the integrated passive components. A first metallization level is deposited on the glass substrate and is used to define tracks 33 and 38 of connection of central ends of planar windings 12 and 14 constitutive of transformer 11. A second metallization level 31 defines a ground plane intended for being connected (terminal 22, FIG. 4) outside of the circuit.

In the example of FIG. 5, three metallization levels separated from one another by an insulator are used. The metallization levels and especially the second one (ground plane) include openings taking part in the component forming.

Transformer 11 is formed by means of two planar concentric conductive tracks. These tracks are respectively formed, for example, in the second and third metallization levels. A first track defines primary winding 12, a first end 12' of which is connected, by section 33 in the first metallization level, to ground plane 31. A second end 12" of winding 12 is connected to a first electrode of capacitor C1 formed, for example, in the second level. A second electrode of capacitor C1, formed for example in the first level, is connected to a conductive section 25' of the second level representing midpoint 25 of FIG. 4. Section 25' connects an emitter terminal 27 of transistor N to a first electrode of capacitor C3 formed, for example, in the first level, to a first electrode of capacitor C4 formed for example in the second level, to the second electrode of capacitor C1 and to a first terminal of resistor R3. Resistor R3 is, like resistors R1 and R2, for example formed by a TaN (tantalum nitride) track in an opening formed in the metallization levels. The other terminal of resistor R3 is connected, for example in the second level, to terminal 26 of application of the control signal. A second electrode of capacitor C4, formed for example in the first level, is connected to ground plane 31. A second electrode of capacitor C3, formed for example in the second level, is connected to a conductive section 24' of the second level symbolized by point 24 of FIG. 4. Section 24' connects a base terminal 28 of transistor N, the second electrode of capacitor C3, a first electrode of capacitor C2, formed for example in the second level in first respective terminals of resistors R1 and R2. The second terminal of resistor R1 is connected to a terminal 29 representing the collector of transistor N. The second terminal of resistor R2 is connected to ground plane 31. The second electrode of capacitor C2, formed for example in the first level, is connected to a first end of a planar concentric winding, formed in the second level in an opening 34 of the ground plane and defining inductance L. The second (central) end of the winding of inductor L is connected, by a section 35 of the third level running over the winding, to ground plane 31. The secondary winding of transformer 11 is obtained by means of a conductive pattern 14 of the third level, concentric to winding 12, and the two ends of which are connected to pads 36 and 37 of the circuit. The central end of winding 14 is connected by section 38 of the first level to a track connecting terminal 37. The different connections between conductive levels are performed by means of vias.

In the embodiment of FIG. 5, the primary and secondary windings of transformer 11 have a same number of spirals. The transformation ratio thus is 1.

In the example of FIG. 5, the second metallization level in which the ground plane is formed is the level in which are also formed most of the connection tracks. Other configurations are of course possible.

As an alternative, only two metallization levels are used. Transformer 11 is then formed by means of two concentric coplanar conductive tracks. These tracks are formed in the first metallization level forming the ground plane in openings of which are also formed, as in FIG. 5, connection tracks, electrodes of the capacitors, winding L and the resistors. The secondary winding of transformer 11 is obtained by means of an imbricated pattern concentric and coplanar to the primary winding. The connections of the central ends of the windings with peripheral elements are formed in the same level.

As an alternative to the representation of FIG. 5 in which the dielectric of transformer 11 is formed of air, it could be provided to cover the front surface of glass substrate 20 with an isolating material (for example, a resin) which will then form the transformer dielectric.

Figure 6:
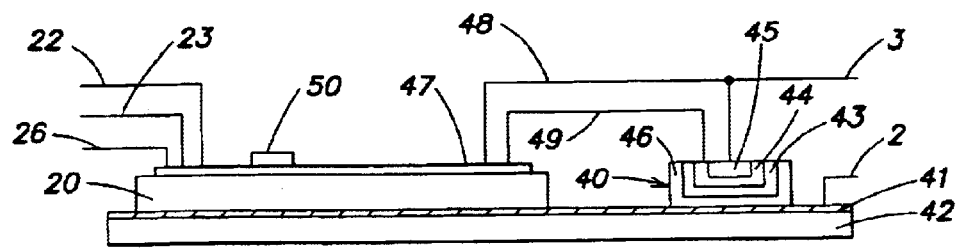
FIG. 6 is a simplified cross-section view of an integrated circuit according to the present invention.

FIG. 6 shows in a very simplified view a circuit according to the present invention seen in cross-section and integrated with switch K. In the example of FIG. 6, a silicon chip 40 on which is formed power switch K is placed on a substrate 42, for example, a printed circuit board or package. Different conductive tracks may be present on the substrate and have been symbolized by a metallization layer 41. Thyristor 40 is very schematically shown in FIG. 6 and is symbolized by an N-type substrate 43, a rear surface of which (provided with a metallization) represents the anode. A track of layer 41 thus connects this anode to terminal 2. At the front surface is present a P-type region 44 in which a P+-type area 45 is formed for the thyristor cathode (it is thus connected to terminal 3), its gate being connected to region 44. At the periphery of chip 40, well 46 enabling the reverse voltage hold of the circuit has been symbolized. The representation of FIG. 6 is purely arbitrary and schematic. In particular, to simplify, diode D1 has not been shown in FIG. 6. In practice, it will be integrated with switch K in chip 40. The forming of the power switch in itself is no object of the present invention. What matters is to have a chip 40 which is placed by one of its power electrodes on a metallization 41 of substrate 42. According to the present invention, glass substrate or wafer 20 supporting the integrated passive components is also placed on substrate 42 by its rear surface (opposite to that provided with the metallizations in which the different components are formed). At the front surface of glass substrate 20, the different passive components have been symbolized by a layer 47 from which the three conductors 22, 23, and 26 of the control circuit extend and, toward chip 40, a conductor 48 connecting pad 36 (FIG. 5) to cathode 3 of switch K, and a conductor 49 connecting the other pad 37 of secondary winding 14 of transformer 11 to region 44.

FIG. 6 shows an alternative of the present invention in which transistor N (FIG. 4) is placed in the form of an integrated circuit chip 50 on the front surface of glass substrate 20. The adapting of this front surface to have the contact pads of the collector, of the emitter, and of the base of transistor N appear in front of those of chip 50 is within the abilities of those skilled in the art.

The representation of FIG. 6 shows that glass substrate 20 not only plays the role of a galvanic isolation barrier for transformer 11, but that it is also used to electrically isolate the control circuit from the tracks of printed circuit 42. This is particularly advantageous since, most often, other components than thyristor K and diode D1 are placed on substrate 42.

In practice, all the passive components of the circuit of the present invention may be integrated on a glass substrate having a side length on the order of from 5 to 10 millimeters. The value of inductance L is, preferably, smaller than some hundred nanohenries. The value of the different capacitances is, preferably, smaller than one nanofarad. The values of the different resistances are, preferably, smaller than 100 kiloohms.

An advantage of the present invention is that it enables integrating all the components of a power switch control circuit, without requiring low-voltage control circuits downstream of the isolation barrier with respect to the control signals.

Another advantage of the present invention is that at the frequencies chosen for the transformer, the capacitors of the oscillator of its control circuit remain integrable.

An advantage of the present invention is that the control circuit is much less bulky than conventional circuits.

Another advantage of the present invention, more specifically as compared to an optocoupler circuit, is that it is no longer necessary to position an optical emitter with respect to a receiver, which, even in an integrated manner, is difficult to obtain in conventional circuits.

Although the present invention has been described hereabove in relation with a power switch formed by a thyristor, said switch may be any power switch, for example, a triac, or an anode-gate thyristor.

Figure 7:
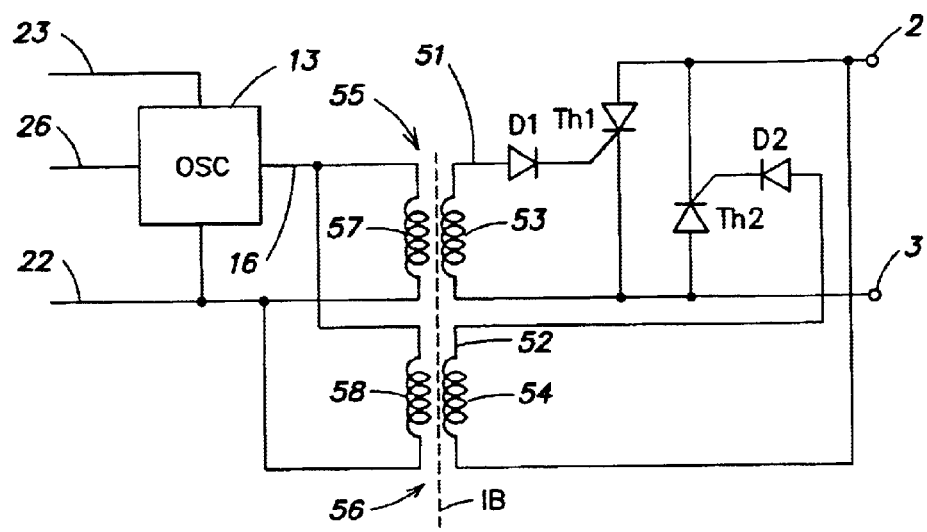
FIG. 7 shows an embodiment of a circuit for controlling two power switches according to the present invention.

FIG. 7 shows a second embodiment of a power switch control circuit according to the present invention. In this embodiment, two thyristors Th1 and Th2 are used downstream of isolation barrier IB. The anode of thyristor Th1 and the cathode of thyristor Th2 are connected to terminal 2. The cathode of thyristor Th1 and the anode of thyristor Th2 are connected to terminal 3. The respective gates of thyristors Th1 and Th2 are connected to the cathodes of diodes D1 and D2 having their respective anodes connected to first ends 51 and 52 of secondary windings 53 and 54 of distinct isolation transformers 55 and 56. Each isolation transformer 55 and 56 is formed in accordance with what has been discussed hereabove in relation with the first embodiment. Accordingly, respective primary windings 57 and 58 of transformers 55 and 56 are controlled by an oscillating circuit 13. A single oscillating circuit 13 is sufficient, its output 16 being connected to a first end of each winding 57 and 58, the respective second ends of which are connected to ground 22 on the primary side. On the secondary side, the ends of windings 53 and 54 are connected, respectively, to terminals 2 and 3. The operation of the circuit of FIG. 7 can be deduced from that discussed hereabove in relation with FIG. 4.

Figure 8:
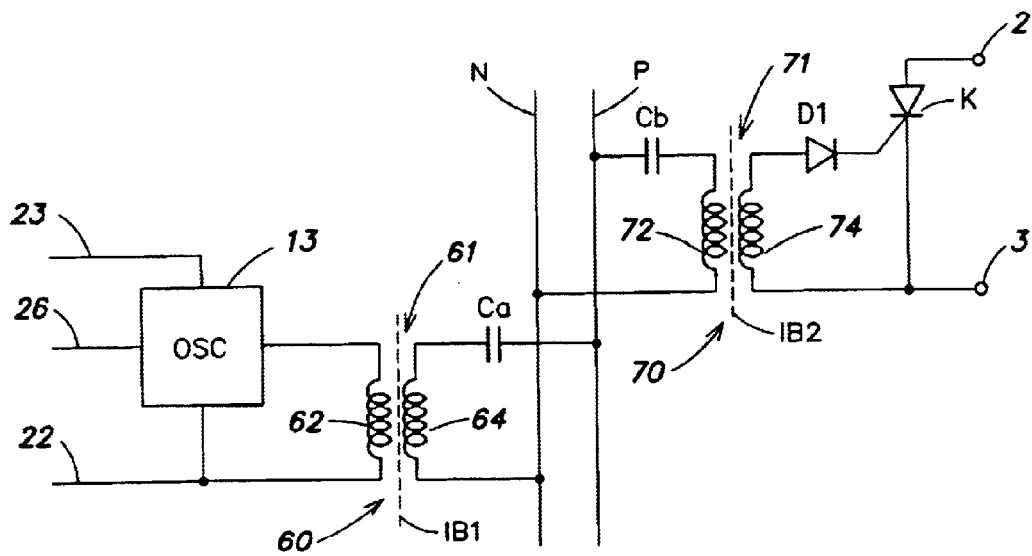
FIG. 8 shows an example of application of the circuit of the present invention to convey control signals in a power switch through an A.C. electric power system.

FIG. 8 shows the simplified electric diagram of an application of the present invention to the transmission of control signals through the electric power system (the mains). This system is symbolized in FIG. 8 by two conductors P and N conveying a low-frequency A.C. voltage (for example, 220 volts, 50 Hz). At a point of the system, a transmitter 60 is provided. This transmitter uses a first transformer 61 according to the present invention controlled by a circuit 13 wired as in the preceding embodiments. The modulation of the signal to be transmitted is, for example, performed by the disable control signal (terminal 26) of circuit 13. Primary 62 of transformer 61 is upstream of a first isolation barrier IB1 which isolates the transformer control from the electric system. Secondary winding 64 of the transformer is connected by each of its ends to conductors P and N of the mains. Preferably, a coupling capacitor Ca is interposed between one of the mains conductors and winding 64. At another point of the system, a receiver 70 of the very-high-frequency signals sent by transformer 61 is provided. On the receive side, a transformer 71 is used to convey these signals through a second isolation barrier IB2 of the receive circuit with respect to the electric system. A primary winding 72 of transformer 71 is connected to conductors P and N of the mains. A decoupling capacitor Cb is, preferably, interposed between one of the conductors and an end of winding 72. A secondary winding 74 of transformer 71 is connected to the control terminal of a power switch K. The two power electrodes 2 and 3 of switch K are series-connected with a load or with a load to be controlled. As previously, a diode D1 is interposed between the control electrode (for example, the gate of a thyristor) and winding 74. As for transformer 61, transformer 71 is a very high frequency transformer according to the present invention. Accordingly, on the side of emitter 60, oscillator 13 and transformer 61 are integrated on a same glass substrate. On the receive side, transformer 71 is integrated on a glass substrate. Switch K and diode D1 are made in the form of an integrated circuit chip placed on a same isolating substrate as transformer 71.

Of course, the present invention is likely to have various alterations, modifications, and improvements which will readily occur to those skilled in the art. In particular, the sizing of the different components of a control circuit according to the present invention is within the abilities of those skilled in the art based on the functional indications given hereabove and on the application. Further, other oscillator structures may be used. Many oscillator structures, preferably based on resistive, capacitive, and inductive components and on at least one bipolar transistor are available to those skilled in the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A circuit for controlling a power switch comprising at least one galvanic isolation transformer made of planar conductive windings on an isolating substrate on which passive components that constitute a high-frequency oscillating circuit driving a primary winding of the transformer are integrated, the substrate being placed on a wafer on which is assembled a circuit chip integrating the power switch.

2. The control circuit of claim 1, wherein an active component of the oscillating circuit for controlling the transformer is made of an integrated circuit chip placed on a surface of said substrate opposite to the wafer on which this substrate is assembled.

3. The control circuit of claim 1, wherein the frequency of the oscillating circuit is greater than 40 MHz.

4. The control circuit of claim 1, wherein said substrate is made of glass.

5. The control circuit of claim 1, wherein a secondary winding of the transformer is connected to a control electrode of the power switch via a diode, the latter forming, with a stray capacitance of the control electrode of the power switch, a peak detector.

6. The control circuit of claim 1, wherein the power switch is a thyristor or a triac.

7. The control circuit of claim 1, including two transformers for controlling two power switches respectively associated with a polarity of an A.C. power supply, the two primary windings of the two transformers being controlled by a same oscillating circuit.

8. A transmission-reception device of a high-frequency signal on a low-frequency supply network, including:
   a transmitter formed of a high-frequency oscillating circuit driving a primary winding of a first transformer having a secondary winding connected to network conductors; and
   a receiver formed of a second galvanic isolation transformer for controlling a switch,
   wherein at least said first transformer is made of planar conductive windings on a first isolating substrate on which are integrated passive components that constitute the oscillating circuit.

9. The device of claim 8, wherein said second transformer is made of planar conductive windings on a second isolating substrate, the second substrate being placed on a wafer on which is assembled a circuit chip integrating the switch.

10. The device of claim 8, wherein an active component of the oscillating circuit for controlling the first transformer is made of an integrated circuit chip placed on a surface of said substrate.

11. The device of claim 8, wherein a secondary winding of the second transformer is connected to a control electrode of the switch via a diode, the latter forming, with a stray capacitance of the control electrode of the switch, a peak detector.

12. A circuit for controlling a power switch, comprising:
   an isolating substrate;
   at least one isolation transformer including conductive windings on the isolating substrate;
   passive components of a high-frequency oscillating circuit driving a primary winding of the isolation transformer and integrated on the isolating substrate;
   a circuit chip integrating the power switch; and
   a wafer on which the isolating substrate and the circuit chip are mounted.

13. A circuit as defined in claim 12, wherein an active component of the oscillating circuit comprises an integrated circuit chip mounted on a surface of said isolating substrate.

14. A circuit as defined in claim 12, wherein the frequency of the oscillating circuit is greater than 40 megahertz.

15. A circuit as defined in claim 12, wherein the isolating substrate comprises glass.

16. A circuit as defined in claim 12, wherein the secondary winding of the transformer is connected through a diode to a control electrode of the power switch, the diode forming, with a stray capacitance of the control electrode, a peak detector.

17. A circuit as defined in claim 12, further comprising a second isolation transformer for controlling a second power switch, a primary winding of the second isolation transformer being controlled by the oscillating circuit.

18. A circuit for controlling a power switch on a low frequency supply network, comprising:

a transmitter including a high-frequency oscillating circuit driving a primary winding of a first isolation transformer, the first isolation transformer having a secondary winding connected to conductors of the supply network, wherein the first isolation transformer comprises conductive windings on a first isolating substrate on which are integrated passive components of the oscillating circuit; and a receiver, including a second isolation transformer for controlling the power switch, coupled to the conductors of the supply network.

19. A circuit as defined in claim 18, wherein the second isolation transformer comprises conductive windings on a second isolating substrate, the second isolating substrate being mounted on a wafer on which is assembled a circuit chip integrating the power switch.

20. A circuit as defined in claim 18, wherein an active component of the oscillating circuit for controlling the first isolation transformer comprises an integrated circuit chip mounted on a surface of the first isolating substrate.

21. A circuit as defined in claim 18, wherein a secondary winding of the second isolation transformer is connected through a diode to a control electrode of the power switch, the diode forming, with a stray capacitance of the control electrode, a peak detector.

* * * * *